(12) United States Patent
Kwan et al.

(10) Patent No.: US 10,432,142 B2
(45) Date of Patent: Oct. 1, 2019

(54) VOLTAGE CONTROLLED OSCILLATOR WITH TUNABLE INDUCTOR AND CAPACITOR

(71) Applicant: Oracle International Corporation, Redwood City, CA (US)

(72) Inventors: Phillip Kwan, San Francisco, CA (US); Xiaolei Li, Arlington, MA (US); Frankie Y. Liu, Palo Alto, CA (US); Ziad Shehadeh, Mountain View, CA (US)

(73) Assignee: Oracle International Corporation, Redwood Shores, CA (US)

( * ) Notice: Subject to any disclaimer, the term of this patent is extended or adjusted under 35 U.S.C. 154(b) by 124 days.

(21) Appl. No.: 15/656,517

(22) Filed: Jul. 21, 2017

(65) Prior Publication Data

US 2019/0028059 A1 Jan. 24, 2019

(51) Int. Cl.
*H03B 5/12* (2006.01)
*H03L 7/093* (2006.01)
*H02M 3/07* (2006.01)
*H03L 7/08* (2006.01)

(52) U.S. Cl.
CPC .......... *H03B 5/1296* (2013.01); *H02M 3/07* (2013.01); *H03B 5/1243* (2013.01); *H03B 5/1256* (2013.01); *H03L 7/08* (2013.01); *H03L 7/093* (2013.01); *H03B 2200/004* (2013.01); *H03B 2200/0038* (2013.01); *H03B 2201/0208* (2013.01); *H03B 2201/0216* (2013.01)

(58) Field of Classification Search
CPC .................................................. H03B 5/1296
USPC ............................................................ 331/8
See application file for complete search history.

(56) References Cited

U.S. PATENT DOCUMENTS

| 9,379,663 | B1* | 6/2016 | Kundu ................. H03B 5/1212 |
| 9,490,827 | B2 | 11/2016 | Wang | |
| 9,660,579 | B2 | 5/2017 | Liu | |
| 9,673,753 | B1 | 6/2017 | Yildirim | |
| 2012/0212300 | A1* | 8/2012 | Tang ..................... H03B 5/1228 331/117 FE |

\* cited by examiner

*Primary Examiner* — Joseph Chang
(74) *Attorney, Agent, or Firm* — Meyertons, Hood, Kivlin, Kowert & Goetzel, P.C.; Eric A. Heter

(57) ABSTRACT

A voltage-controlled oscillator (VCO) having an LC tank circuit with a variable inductance is disclosed. In one embodiment, the VCO includes a capacitance, at least a portion of which is variable and responsive to a first tuning voltage. The VCO further includes a transformer having first (primary) and second (secondary) windings. The primary winding is coupled to the capacitance, and provides the inductance of the LC tank circuit. The secondary winding is coupled to a current control circuit. The current control circuit may vary the induced current through the secondary winding. By varying the induced current through the secondary winding, the effective inductance of the primary winding may also be varied. Accordingly, the VCO may be tuned by varying the inductance of the LC tank circuit, as well as by varying the capacitance of the same.

17 Claims, 8 Drawing Sheets

VOLTAGE CONTROLLED OSCILLATOR WITH TUNABLE INDUCTOR AND CAPACITOR

BACKGROUND

Technical Field

This disclosure is directed to electronic circuits, and more particularly, to voltage-controlled oscillators.

Description of the Related Art

Phase-locked loops (PLLs) are commonly used in electronic circuit and integrated circuits (ICs) to generate and control the frequency of clock signals. A typical PLL includes a voltage-controlled oscillator (VCO) that generates the output clock signal based on a reference signal and a divisor ratio used in generating a feedback signal.

There are two types of VCOs most commonly used in PLLs. A first type is a ring oscillator type, which includes an odd number of inverters coupled with a feedback loop to maintain oscillation. A second type is implemented using an inductive-capacitive (LC) tank circuit. An LC tank circuit includes a capacitance and an inductance coupled in a parallel tank topology. The output signal may be taken from either of the junctions between the capacitor and the inductor. Tuning of the LC tank circuit may be accomplished by providing a tuning voltage to a variable capacitor of the capacitance. This may change the overall capacitance in the LC tank circuit, and thus change the frequency of oscillation of the circuit.

SUMMARY

A voltage-controlled oscillator (VCO) having an LC tank circuit with a variable inductance is disclosed. In one embodiment, the VCO includes a capacitance, at least a portion of which is variable and responsive to a first tuning voltage. The VCO further includes a transformer having first (primary) and second (secondary) windings. The primary winding is coupled to the capacitance, and provides the inductance of the LC tank circuit. The secondary winding is coupled to a current control circuit. The current control circuit may vary the induced current through the secondary winding. By varying the induced current through the secondary winding, the effective inductance of the primary winding may also be varied. Accordingly, the VCO may be tuned by varying the inductance of the LC tank circuit, as well as by varying the capacitance of the same.

In one embodiment, the current control circuit includes one or more transistors each having a source-drain path coupled in series with the secondary winding. A voltage on a gate terminal of the transistor(s) may be adjusted to correspondingly adjust the current through the transistor and thus through the secondary winding. The transistor(s) may be operated in the linear range (as opposed to cutoff or saturated) in order to control the current based on the voltage on the gate terminal. A digital control circuit may in one embodiment output a digital code indicative of the desired voltage for the gate terminal. A digital-to-analog (D/A) converter may convert the code to the analog voltage that is then applied to the gate terminal(s) of the transistor(s).

The range of effective inductance for the primary winding may depend at least partly upon a switch capacitance of the transistor(s). Accordingly, the transistor(s) (and thus the switch capacitance) may be selected based on a desired frequency of operation for the VCO and a desired tuning range.

At least a portion of the capacitance of the VCO may also be variable. Accordingly, the VCO may be tuned by both inductive and capacitive adjustments. Embodiments are also possible and contemplated in which the capacitance remains fixed, and thus the VCO is tuned based on varying the inductance in the LC tank circuit.

BRIEF DESCRIPTION OF THE DRAWINGS

The following detailed description makes reference to the accompanying drawings, which are now briefly described.

Figure 1:
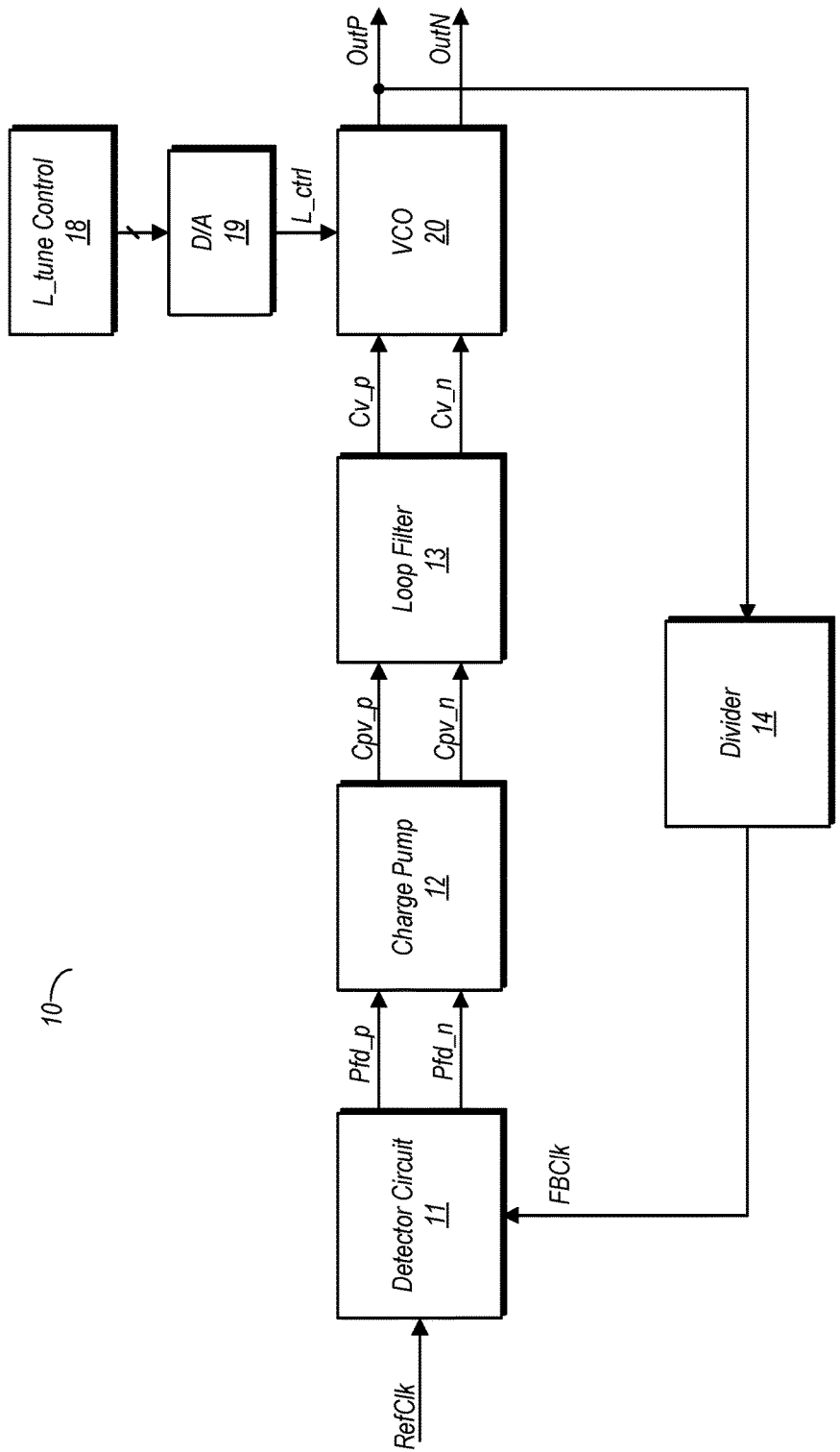
FIG. 1 is a block diagram of one embodiment of a phase-locked loop (PLL) according to the disclosure.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In the following description, numerous specific details are set forth to provide a thorough understanding of the disclosed embodiments. One having ordinary skill in the art, however, should recognize that aspects of disclosed embodiments might be practiced without these specific details.

DETAILED DESCRIPTION OF EMBODIMENTS

FIG. 1 is a block diagram of one embodiment of a phase-locked loop (PLL) according to the disclosure. In the embodiment shown, PLL 10 includes a detector circuit 11, a charge pump 12, a loop filter 13, a voltage-controlled oscillator (VCO) 20, and a divider 14. Additionally, as is discussed further below, PLL 10 also include an inductance tuning control circuit, L_tune control circuit 18, and a digital-to-analog (D/A) converter 19 coupled to receive a digital code therefrom. D/A converter 19 is in turn coupled to provide a tuning voltage, L_ctrl, to VCO 20, which is one of two different tuning voltages this VCO may receive.

Detector 11 in the embodiment shown may be either a phase detector or a frequency detector. As a phase detector, detector 20 may detect a phase difference between a received reference clock signal (RefClk) and a feedback clock signal (FBClk) that is generated by dividing the output clock signal. As a frequency detector, detector 20 may detect a frequency difference between the reference clock signal and the feedback clock signal.

The output provided by detector 20 in this particular embodiment is a differential output, which includes signals Pfd_p and Pfd_n. The differential value of the output of detector circuit 11 is indicative of the phase or frequency difference (depending on the implementation) between the reference and feedback clock signal. Charge pump 12 in the embodiment shown acts bipolar current switch, providing current to or drawing current from loop filter 13 dependent on the phase/frequency difference as indicated by the signals output from detector circuit 11.

Loop filter 13 in the embodiment shown is coupled to receive differential signals Cpv_p and Cpv_n from charge pump 12. Loop filter 13 may smooth out variations in the signals provided from charge pump 12 to generate and output a differential tuning voltage (Cv_p and Cv_n) provided to VCO 20.

In the embodiment shown, VCO 20 is implemented using an inductive-capacitive (LC) tank circuit. In this embodiment, VCO 20 may be tuned by varying a capacitance or an inductance. A variable capacitance within VCO 20 may be adjusted based on the differential tuning voltage, Cv_p and Cv_n, output by loop filter 13. Additionally, a variable inductance within VCO 20 may be adjusted by the tuning voltage L_ctrl. This tuning voltage may be set based on a desired value that is digitally input into L_tune control circuit 18, which may then provide a corresponding digital code to D/A converter 19. This code is then converted into the analog tuning voltage L_ctrl. Thus, the LC tank circuit utilized in VCO 20 can be tuned by varying an inductance in addition to (or in lieu of) varying the capacitance. User and/or software input may be used to set the desired value for the tuning voltage into control circuit 18.

Figure 2:
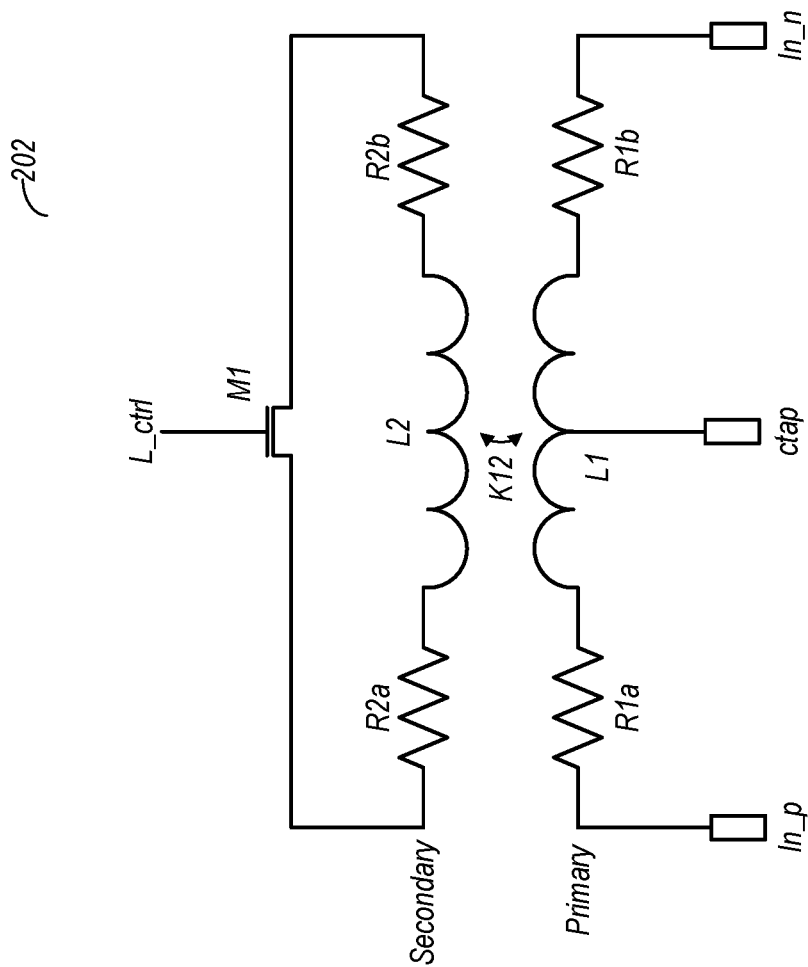
FIG. 2 is a schematic diagram illustrating a transformer used in one embodiment of a voltage-controlled oscillator.

The variable inductance used in one embodiment of VCO 20 may be implemented using a transformer. FIG. 2 is a schematic diagram illustrating a transformer used in one embodiment of a voltage-controlled oscillator. In the embodiment shown, transformer 202 includes a primary winding including inductor L1, and a secondary winding including inductor L2, with the transforming having a coupling factor K12. The resistances as shown herein (R1a, R1b, R2a, and R2b) are inherent resistances in the coils and wiring of transformer 202.

Inductor L2 of the secondary winding in transformer 202 is coupled in series with a transistor M1. For the sake of simplifying the discussion, only one transistor is referred to herein, although it is to be understood that multiple transistors coupled in parallel may be implemented in lieu of a single instance of transistor M1. In the embodiment shown, transistor M1 may effectively act as a current control circuit, controlling the amount current flowing through secondary winding L2. During normal operation, transistor M1 may be operated in the linear region (although this is not an absolute requirement), and thus its current may vary with the tuning voltage L_ctrl, which is received on its gate terminal. By varying the current through the secondary winding, the effective inductance of the primary winding may by correspondingly varied. As defined herein, the effective inductance of the primary winding may be that inductance that is seen by the LC tank circuit of VCO 202.

The primary winding in the embodiment shown also includes a center tap point, ctap, which may be connected to a current source (and through which current is provided to the LC tank circuit). The other two terminals, In_p and In_n, couple the primary winding to the capacitance of the LC tank circuit. The inductance seen by the LC tank circuit is that which is present between In_p and In_n.

Figure 3:
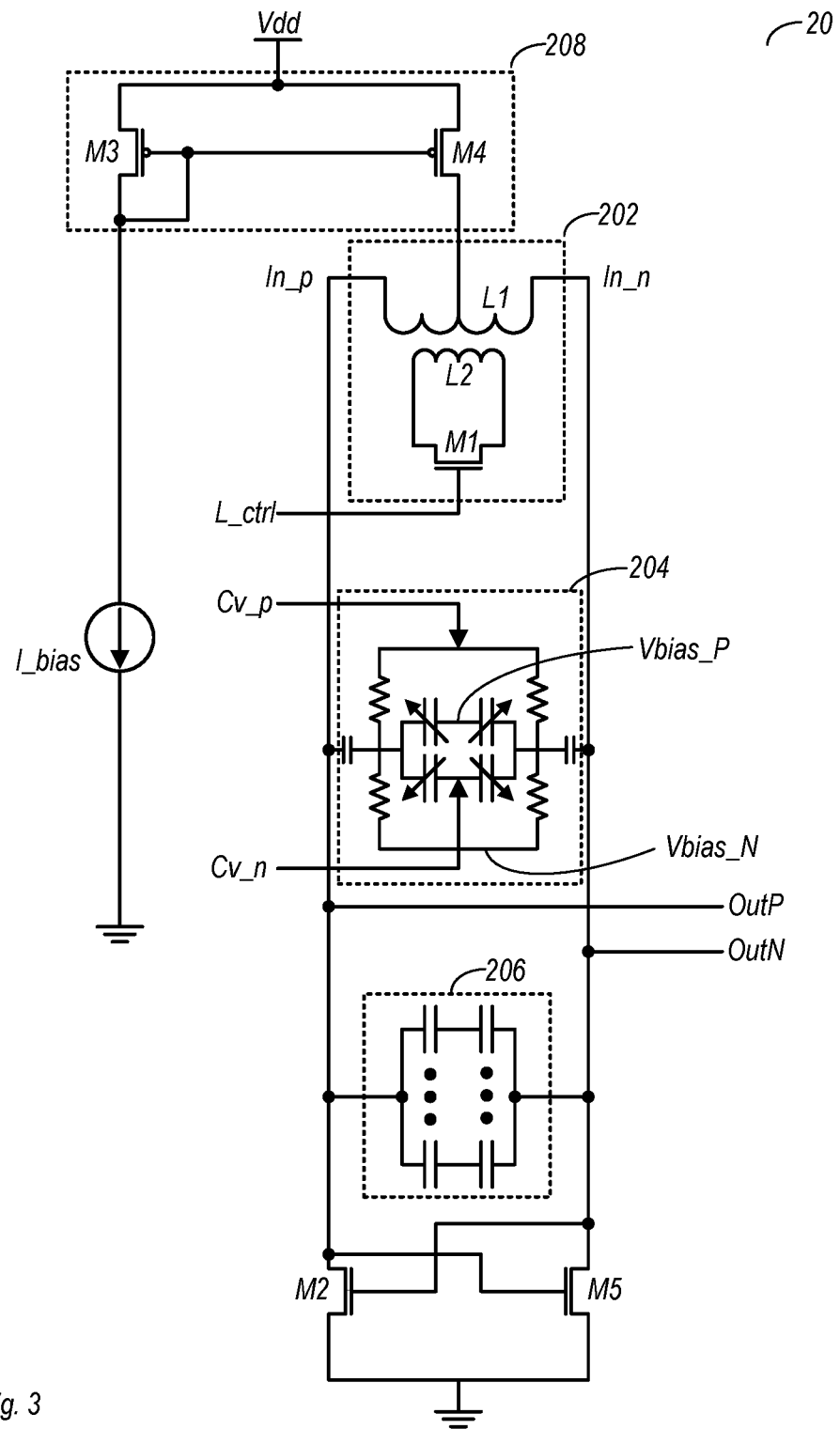
FIG. 3 is a schematic diagram illustrating the circuit topology of one embodiment of a VCO.

FIG. 3 is a schematic diagram illustrating the circuit topology of one embodiment of a VCO. In the embodiment shown, VCO 20 implements an LC tank circuit that includes inductor L1 of transformer 202, a variable capacitance bank 204, and a bulk capacitance bank 206 (which may be fixed or variable). Each of variable capacitance bank 204 and bulk capacitance bank 206 may comprise one or more capacitors. In this particular embodiment, the LC tank circuit of VCO 20 also includes transistors M2 and M5, which may operate in accordance with the oscillation within the LC tank circuit. However, embodiments that do not utilize these transistors are also possible and contemplated.

In the embodiment shown, VCO 20 may be tuned in the traditional manner (by adjusting the capacitance of the LC tank circuit) or by adjusting the inductance of the LC tank circuit. VCO 20 as shown here includes a bulk capacitance 206 (which is a fixed capacitance) and a variable capacitance 204. The capacitance of the LC tank circuit may be adjusted by changes to the differential tuning voltage that is comprised by signals Cv_p and Cv_n, which in turn affect the voltages on nodes Vbias_P and Vbias_N. It is noted that embodiments in which the tuning voltage is a single-ended signal are also possible and contemplated. Furthermore, it is noted that embodiments do not include the bulk capacitance (and thus implement only a variable capacitance) are also possible and contemplated. Adjustments to the differential tuning voltage, and thus the capacitance of the LC tank circuit, can cause corresponding changes to the frequency of the output signal. As shown here, the output signal is also a differential signal comprising OutP and OutN, although either terminal may be used to provide a single-ended output signal.

Tuning the frequency of the output signal of VCO 20 may also be accomplished via changes to a second tuning voltage, L_ctrl. This turning voltage is applied to the gate terminal of transistor M1, which is coupled in series with the secondary winding, L2, of transformer 202. Transistor M1 as implemented here functions as a current control circuit, controlling the amount of current through secondary winding L2. More particularly, transistor M1 may operate primarily in the linear region during operation of VCO 20, with the source-drain current through this device corresponding to the voltage on its gate terminal, L_ctrl.

Varying the current through the secondary winding L2 may cause corresponding variations in the loading of the secondary winding. From an electromagnetic point of view, varying the loading in the secondary winding may in turn vary the induced current and magnetic flux between the windings. Correspondingly, this may cause variations to the effective inductance of the primary winding L1. The effective inductance may be defined as the inductance between the terminals of the primary winding (e.g., In_p and In_n) as seen by the LC tank circuit. Varying the effective inductance of the primary winding L1, and thus the LC tank circuit as a whole, may therefore cause corresponding variations to the frequency of the output signal provided by VCO 20. Furthermore, operating transistor M1 may allow the effective inductance of the primary winding to be controlled over a continuous range of inductances. In some instances, the operation of transistor M1 may occur in the linear range, although operation outside of this range is also contemplated.

Providing the ability to tune VCO 20 by varying the inductance as well as the capacitance may result in a substantially wider tuning range relative to the method of tuning based solely on a variable capacitance. This may make VCO 20 suitable for use in applications in which a wide range of frequencies is desired. Furthermore, the ability to tune using both the capacitance and the inductance may allow for a large number of narrow bands in which VCO 20 may operate.

Current may be applied to the LC tank circuit of VCO 20 via reference current circuit that includes a current mirror 208. In the embodiment shown, current mirror 208 includes transistors M3 and M4. Transistor M3 is coupled to a bias current source, I_bias, and is further coupled to mirror its current to transistor M4. The drain terminal of M4 is coupled to a center tap (e.g., ctap of FIG. 2) of primary winding L1.

Figure 4:
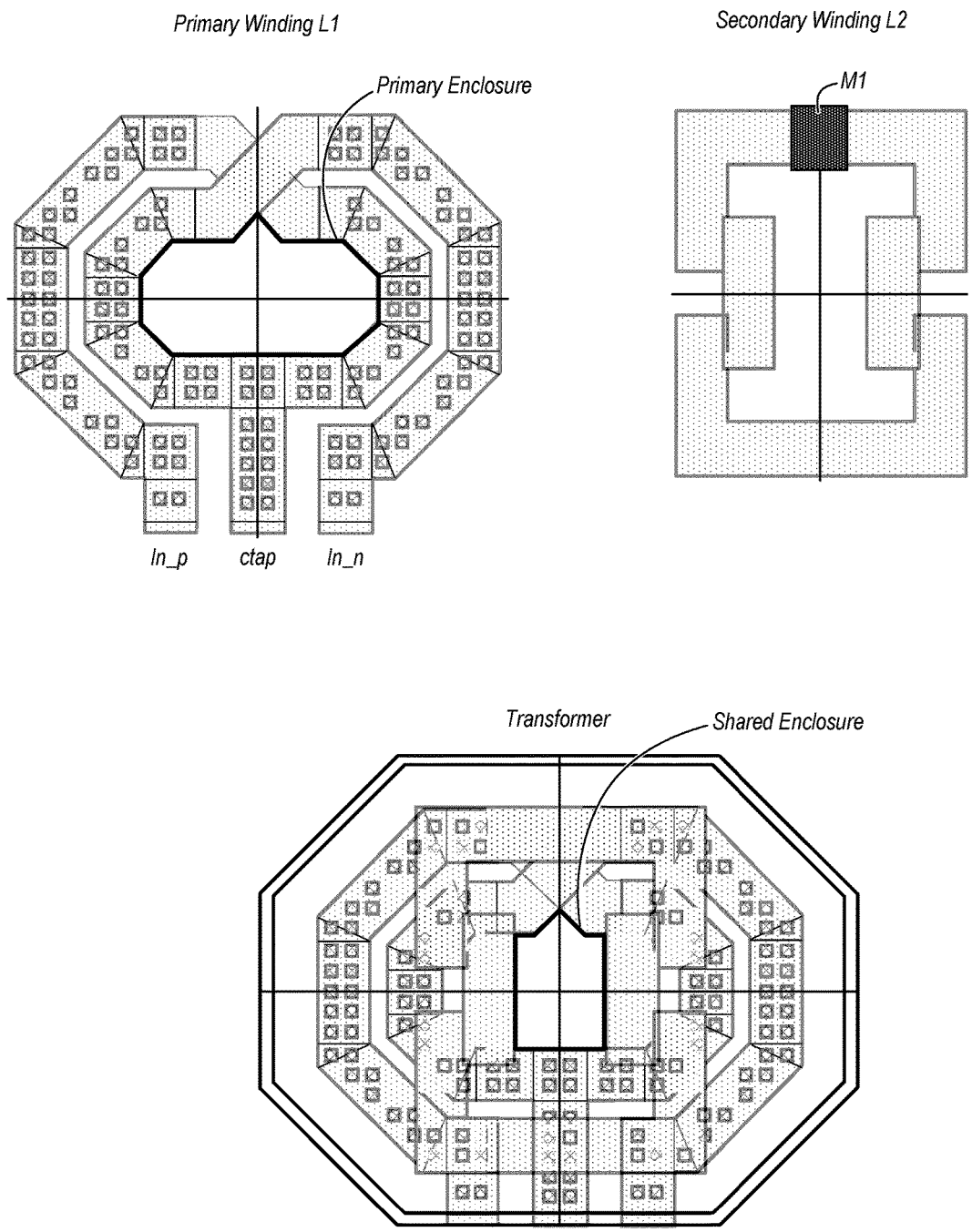
FIG. 4 is an illustration of a layout of the primary and secondary windings for one embodiment of a transformer used to implement an inductance in a VCO.

In designing VCO 20, it may be desired to maximize the quality factor (Q-factor) of the LC tank circuit. This may be accomplished by minimizing the effective resistance in the transformer windings, thereby minimizing energy loss in the LC tank circuit during oscillation. In the various embodiments discussed herein, the shape of the secondary winding may be deformed relative to that of the primary winding in order to reduce the effective resistance and thus maximize the Q-factor. FIG. 4 is an illustration of a layout of the primary and secondary windings for one embodiment of a transformer in which the shape of the secondary winding is deformed relative to that of the primary winding.

In FIG. 4, the primary and secondary windings are shown separately at the top, and together at the bottom. In viewing the primary winding, the enclosure near the middle thereof is highlighted. In an embodiment in which the primary and secondary windings were of the same shape and overlapping one another to form the transformer, the shared enclosure would be similar if not the same as that of the primary winding enclosure. However, as shown in the drawing, the secondary winding has a significantly different shape relative to the primary winding.

The composite the primary and secondary windings as overlying one another to form the transformer is shown at the bottom of FIG. 4. As can be seen the shared enclosure is smaller than the enclosure of the primary winding only. This is due to the deformed shape of the secondary winding (relative to the shape of the primary winding). The (relatively) smaller shared enclosure is at least in part a result of design parameters in which both the inductance and effective of the secondary winding are increased, while the coupling factor is decreased due to the deformed shape of the secondary winding. This may in turn result in the same effective inductance and a lower effective resistance between In_p and In_n in the primary winding.

Another factor in the design of the LC tank circuit (and thus the VCO) disclosed herein is the switch capacitance of transistor M1, which (as noted above) is implemented as a current control circuit for controlling the current in the secondary winding. The effect of the switch capacitance on the LC tank circuit is graphically illustrated in FIG. 5. The graph on the right of FIG. 5 illustrates the effect of a larger switch capacitance in the current control transistor relative to that depicted by the graph on the left.

It is noted that in the graph, the relatively flat curve represents a gate voltage on the transistor of 0 volts, while the gate voltage on the right is supply voltage (Vdd) value.

In the graph on the right, the resonant frequency of the depicted transistor is lower while the effective inductance (L_eff) tuning range of the LC tank circuit is significantly larger relative to their counterparts in the graph on the left. For example, at the exemplary frequency of 15 GHz as shown in both graphs, the effective inductance tuning range of the circuit depicted by the graph on the right much wider than that on left, as indicated by the distance between the curves. This translates into a wider tuning range overall (e.g., wider range of available output frequencies) relative to the embodiment depicted by the graph on the left.

Figure 5:
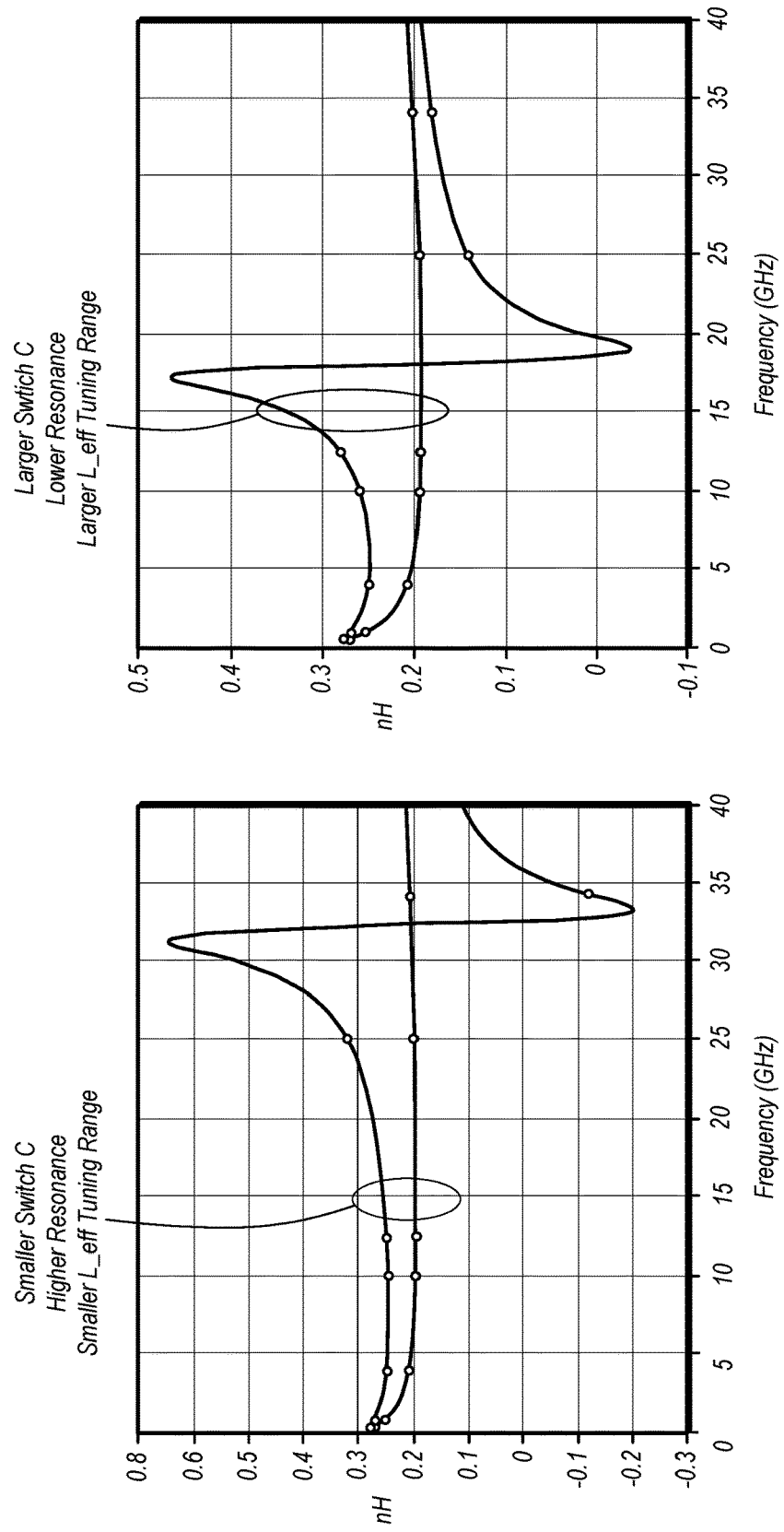
FIG. 5 is a pair of graphs illustrating the relationship between the switch capacitance of a current control transistor and the effective inductance of the secondary winding.

In light of the effects illustrated in FIG. 5, some embodiments of the circuits disclosed herein may be designed such that the current control transistor (e.g., M1 of FIGS. 2 and 3) has switch capacitance value that allows the circuit to achieve the desired tuning range and operation at selected frequencies. In conjunction with the variable capacitance of the LC tank circuit, a wide tuning range for the effective inductance may thus result in a VCO having a much wider range of output frequencies relative to traditional embodiments in which only the capacitance is varied but the inductance is fixed.

Figure 6:
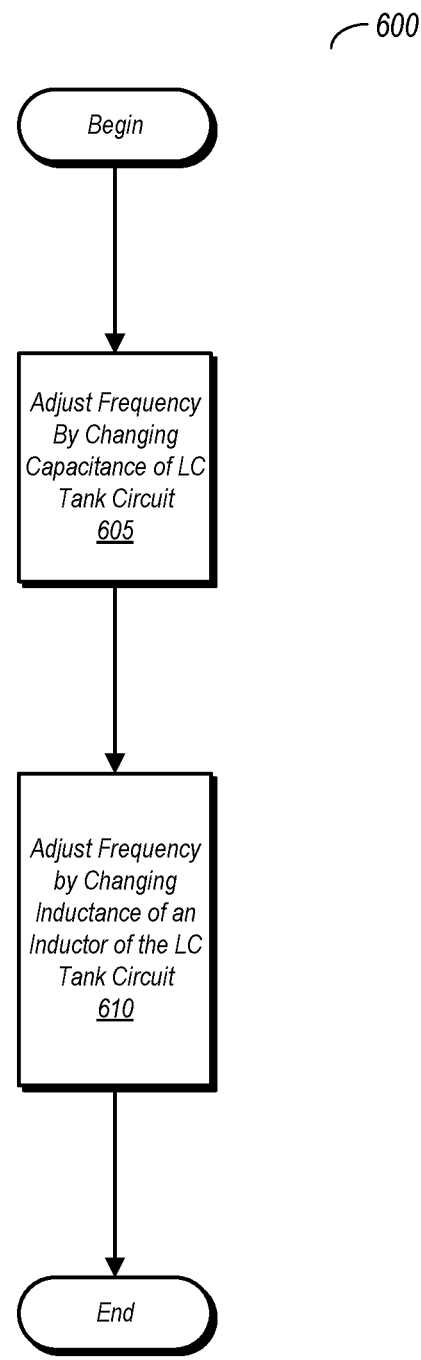
FIG. 6 is a flow diagram illustrating one embodiment of a method for operating a VCO.

FIG. 6 is a flow diagram illustrating one embodiment of a method for operating a VCO. Method 600 as illustrated in FIG. 6 may be performed by any of the embodiments of a VCO discussed above and illustrated in the other figures. Furthermore, method 600 may apply to any LC-tank-based VCO in which both the capacitance and inductance are variable and thus available for use in tuning the circuit. Accordingly, such embodiments of an LC tank circuit and a VCO based thereon may be considered to fall within the scope of this disclosure.

Method 600 begins with a frequency adjustment performed by changing the capacitance of an LC tank circuit used to implement a VCO (block 605). Method 600 further includes adjusting the frequency of the VCO by changing the inductance of an inductor implemented in the LC tank circuit (block 610). In the circuit embodiments discussed above, this may be accomplished by implementing the inductor as the primary winding of a transistor and varying the current through the secondary winding so as to vary the effective inductance of the primary winding. However, other circuit embodiments are possible and contemplated. In general, any circuit embodiment in which an LC tank circuit includes both a variable capacitance and variable inductance may be performed by FIG. 6 and may fall within the scope of this disclosure.

Figure 7:
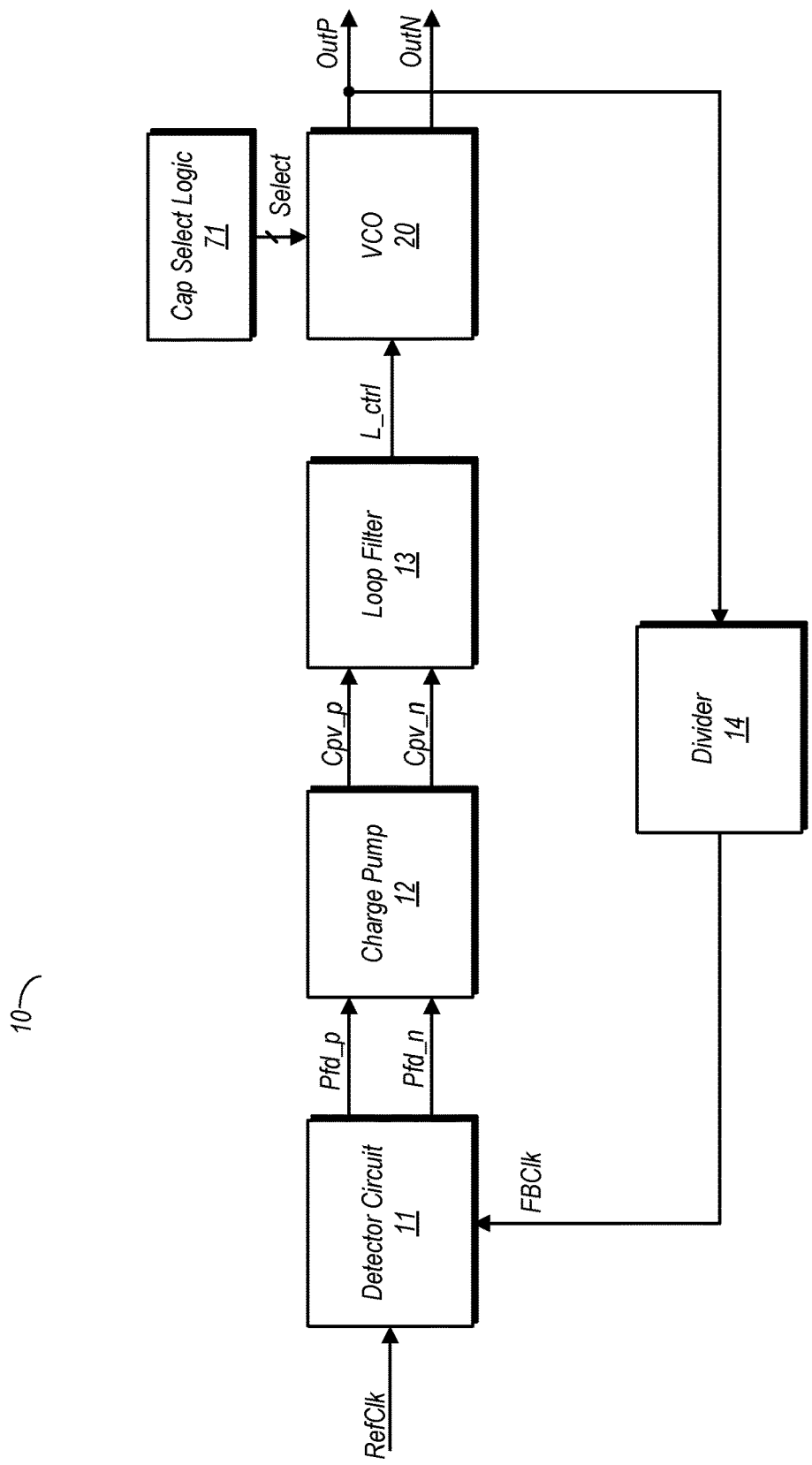
FIG. 7 is a block diagram of another embodiment of a PLL.

FIG. 7 is a block diagram of another embodiment of a PLL. In this particular embodiment of PLL 10, VCO 20 is coupled to receive the tuning voltage L_ctrl from loop filter 13. Accordingly, instead of loop filter 13 providing a tuning voltage to a variable capacitor, the tuning voltage may be provided to a current control circuit coupled to a winding of a transformer so as to vary the effective inductance in the LC tank circuit. To put it another way, the tuning voltage used to tune the inductance in the LC tank circuit is part of the PLL loop.

In the embodiment shown, PLL 20 includes cap select logic 71. Within VCO 20, the bulk capacitance may be variable, with the actual amount provided to the LC tank circuit based on select signals from cap select logic 71.

Variation of the bulk capacitance may be performed for the purpose coarse frequency selection/tuning in the illustrated embodiment. Cap select logic 71 may assert/de-assert selection signals in accordance with the amount of capacitance desired. Capacitors may be switched in or out of the LC tank circuit based on the selection signals.

Whereas the bulk capacitance is varied for the purposes of coarse frequency selection/tuning, fine tuning of the frequency of the VCO output signal may be based on the effective inductance in the LC tank circuit as set according to the tuning voltage, L_ctrl, provided from loop filter 13.

It is noted that while the embodiment of PLL 20 shown in FIG. 7 includes cap select logic 71, embodiments in which the capacitance of the LC tank circuit remains a substantially fixed value are possible and contemplated. In such embodiments with a fixed bulk capacitance, no cap select logic 71 is included.

Figure 8:
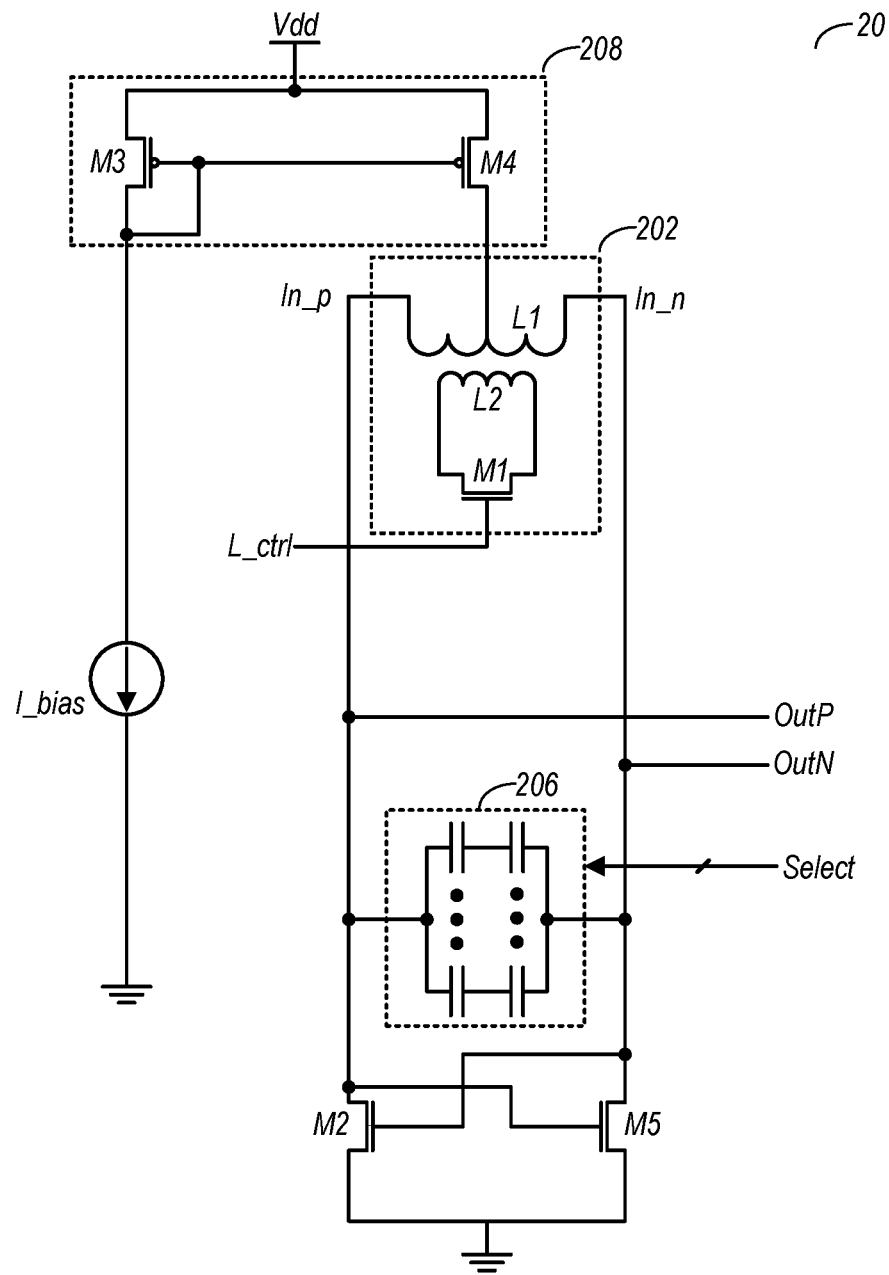
FIG. 8 is a schematic diagram illustrating the circuit topology of another embodiment of a VCO.

FIG. 8 is a schematic diagram of one embodiment of an LC tank circuit in which may be implemented in VCO 20 of the embodiment shown in FIG. 7. The embodiment shown in FIG. 8 is similar to that shown in FIG. 3, with the primary difference being the exclusion of any fine-tuning variable capacitance. Instead, in the embodiment shown in FIG. 8, bulk capacitance 206 is variable, with its value dependent on select signals received from an external source (e.g., cap select logic 71 of FIG. 7). In such an embodiment, the amount of bulk capacitance provided to the LC tank circuit may be varied for the purposes of coarse frequency selection, while the effective inductance of winding L1 is varied for the purposes of fine frequency tuning.

Numerous variations and modifications will become apparent to those skilled in the art once the above disclosure is fully appreciated. It is intended that the following claims be interpreted to embrace all such variations and modifications.

What is claimed is:

1. A circuit comprising:
a variable capacitance bank comprising one or more capacitors;
a transformer having a first winding and a second winding, wherein the first winding and the variable capacitance bank are arranged to form an inductive-capacitive (LC) tank circuit of a voltage-controlled oscillator (VCO);
a current control circuit coupled to the second winding, wherein the current control circuit is configured to vary an effective inductance of the first winding by controlling an amount of current flowing through the second winding; and
a reference current circuit coupled to inject a current into a center tap of the first winding;
wherein a frequency of a signal generated by the VCO is adjustable by adjusting the effective inductance of the first winding.

2. The circuit as recited in claim 1, wherein the current control circuit comprises at least one transistor having a source-drain path coupled in series with the second winding, wherein the transistor is operable to control the current through the second winding when operating in a linear region.

3. The circuit as recited in claim 2, wherein the current control circuit further comprises:
a digital controller configured to generate a digital value indicative of a desired value of a tuning voltage provided to a gate terminal of the transistor;
a digital-to-analog converter configured to convert the digital value into the desired value of the tuning voltage.

4. The circuit as recited in claim 2, wherein a tuning range of the effective inductance is dependent on a switch capacitance of the transistor, and wherein the transistor is selected based on a design frequency and a desired tuning range of the effective inductance.

5. The circuit as recited in claim 1, wherein the first winding has a first shape and wherein the second winding has a second shape different from the first shape.

6. The circuit as recited in claim 1, wherein the LC tank circuit further comprises a bulk capacitance bank.

7. The circuit as recited in claim 1, wherein the current control circuit is configured to tune the effective inductance of the first winding over a continuous range of inductances.

8. A method comprising:
adjusting a frequency of a signal generated by a voltage-controlled oscillator (VCO) by adjusting a capacitance provided by a variable capacitor of an inductive-capacitive (LC) tank circuit in accordance with a first tuning voltage;
adjusting the frequency of the signal generated by the VCO by controlling an effective inductance of a first winding of a transformer in accordance with a second tuning voltage, wherein the first winding is coupled to the variable capacitor to form the LC tank circuit, wherein the transformer further includes a second winding, wherein controlling the effective inductance of the first winding comprises a current control circuit controlling a current through the second winding;
wherein the method further comprises a reference current circuit injecting a current into a center tap of the first winding.

9. The method as recited in claim 8, wherein controlling the effective inductance of the first winding comprises providing the second tuning voltage to gate terminal of a transistor coupled to the second winding, the transistor comprising a portion of the current control circuit, wherein a source-drain path of the transistor is coupled in series with the second winding.

10. The method as recited in claim 9, further comprising:
a digital controller generating a digital value indicative of a desired value of the second tuning voltage; and
a digital-to-analog converter (DAC) converting the digital value into the second tuning voltage.

11. The method as recited in claim 8, further comprising the current control circuit tuning the effective inductance of the first winding over a continuous range of inductances.

12. A phase-locked loop comprising:
a voltage-controlled oscillator (VCO) having an inductive-capacitive (LC) tank circuit, the LC tank circuit including a bulk capacitance bank having one or more capacitors, and a first winding of a transformer, the transformer including the first winding and a second winding;
a reference current circuit coupled to inject a current into a center tap of the first winding;
a low-pass filter configured to generate a first tuning voltage; and
a current control circuit coupled to the second winding, wherein the current control circuit is coupled to receive the first tuning voltage from the low-pass filter and is configured to control an effective inductance through the first winding by controlling a current through the second winding, wherein a frequency of an output signal provided by the VCO is based on the effective inductance through the first winding.

13. The phase-locked loop as recited in claim 12, wherein the phase-locked loop further comprises:
   a charge pump coupled to provide a differential voltage to the low-pass filter;
      a detector circuit configured to provide a signal to the charge pump indicative of one of a phase difference or a frequency difference between a reference signal and a feedback signal; and
      a divider circuit coupled between an output of the VCO and the detector circuit and configured to generate the feedback signal.

14. The phase-locked loop as recited in claim 12, wherein the current control circuit comprises a transistor coupled to the second winding, the transistor having a gate terminal coupled to receive the first tuning voltage, wherein a tuning range of the effective inductance is dependent on a switch capacitance of the transistor, and wherein the transistor is selected based on a design frequency and a desired tuning range of the effective inductance.

15. The phase-locked loop as recited in claim 14, wherein a source-drain path of the transistor is coupled in series with the second winding, wherein the transistor is operable to control the current through the second winding when operating in a linear region.

16. The phase-locked loop as recited in claim 12, wherein the first winding has a first shape and wherein the second winding has a second shape different from the first shape.

17. The phase-locked loop as recited in claim 12, wherein the current control circuit is configured to tune the effective inductance of the first winding over a continuous range of inductances.

* * * * *

UNITED STATES PATENT AND TRADEMARK OFFICE
CERTIFICATE OF CORRECTION

PATENT NO.         : 10,432,142 B2
APPLICATION NO.    : 15/656517
DATED              : October 1, 2019
INVENTOR(S)        : Kwan et al.

Page 1 of 1

It is certified that error appears in the above-identified patent and that said Letters Patent is hereby corrected as shown below:

On the Title Page

Item (74), Column 2, under Attorney, Agent, or Firm, Line 2, delete "Eric" and insert -- Erik --, therefor.

In the Drawings

On sheet 5 of 8, in FIG. 5, Line 1, delete "Larger Swtich C" and insert -- Larger Switch C --, therefor.

In the Specification

In Column 4, Line 5, delete "by" and insert -- be --, therefor.

Signed and Sealed this
Twentieth Day of October, 2020

Andrei Iancu
*Director of the United States Patent and Trademark Office*